United States Patent
Schwartz et al.

(10) Patent No.: US 9,759,763 B2
(45) Date of Patent: Sep. 12, 2017

(54) DAMAGE REDUCTION METHOD AND APPARATUS FOR DESTRUCTIVE TESTING OF POWER SEMICONDUCTORS

(75) Inventors: Rodney E. Schwartz, Tiki Island, TX (US); Steve Clauter, Tempe, AZ (US); David Lohr, Chandler, AZ (US); Gary Rogers, Mesa, AZ (US); James Baggiore, Avondale, AZ (US)

(73) Assignee: Integrated Technology Corporation, Temp, AZ (US)

( * ) Notice: Subject to any disclaimer, the term of this patent is extended or adjusted under 35 U.S.C. 154(b) by 244 days.

(21) Appl. No.: 13/560,233

(22) Filed: Jul. 27, 2012

(65) Prior Publication Data

US 2013/0027067 A1   Jan. 31, 2013

Related U.S. Application Data

(60) Provisional application No. 61/512,481, filed on Jul. 28, 2011.

(51) Int. Cl.

| | | |
|---|---|---|
| *G01R 1/067* | (2006.01) | |
| *G01R 1/36* | (2006.01) | |
| *G01R 31/12* | (2006.01) | |
| *G01R 31/27* | (2006.01) | |
| *G01R 31/28* | (2006.01) | |
| *G01R 31/26* | (2014.01) | |
| *G01R 31/02* | (2006.01) | |

(52) U.S. Cl.
CPC ........ *G01R 31/2621* (2013.01); *G01R 31/025* (2013.01)

(58) Field of Classification Search
CPC ........ G01R 31/00; G01R 31/26; G01R 31/28; G01R 19/0092; G01R 1/203; G01R 1/06766; G01R 1/36; G01R 31/129; G01R 31/275; G01R 31/2886; G01R 31/025; G01R 31/2621; G01R 1/067
USPC .......... 324/750.01, 762.01–762.03, 324/762.06–762.09, 76.11, 755.11, 110, 324/762.05; 257/48

See application file for complete search history.

(56) References Cited

U.S. PATENT DOCUMENTS

| | | | |
|---|---|---|---|
| 5,789,951 A * | 8/1998 | Shen et al. ..................... | 327/110 |
| 2007/0182435 A1 | 8/2007 | Lui et al. | |
| 2008/0186048 A1* | 8/2008 | Lui et al. ..................... | 324/769 |

(Continued)

FOREIGN PATENT DOCUMENTS

| | | |
|---|---|---|
| DE | 10 2011 108 897 A1 | 2/2012 |
| JP | 2007-33042 | 2/2007 |

(Continued)

OTHER PUBLICATIONS

Partial International Search Report for International Application No. PCT/US2012/048563 mailed Oct. 31, 2012.

*Primary Examiner* — Tung X Nguyen
*Assistant Examiner* — Neel Shah
(74) *Attorney, Agent, or Firm* — Renner, Otto, Boisselle & Sklar LLP

(57) ABSTRACT

A device and method for limiting damage to a semiconductor device under test when the semiconductor device fails during a high current, or high power test is provided. The occurrence of a failure of the device under test is detected, and power applied to the semiconductor device is diverted through a parallel path element upon detection of failure of the semiconductor device.

19 Claims, 6 Drawing Sheets

(56) References Cited

U.S. PATENT DOCUMENTS

2008/0290882 A1\* 11/2008 Rogers .................... G01R 1/36
                                                     324/755.11
2012/0133388 A1\* 5/2012 Bernoux et al. ......... 324/762.01
2012/0153977 A1\* 6/2012 Amanuma ......... G01R 31/2637
                                                     324/750.15

FOREIGN PATENT DOCUMENTS

| JP | 2007033042 A | \* | 2/2007 | |
|---|---|---|---|---|
| JP | 2009-145302 | | 7/2009 | |
| TW | 201231995 A1 | \* | 8/2012 | ............. G01R 31/26 |

\* cited by examiner

DAMAGE REDUCTION METHOD AND APPARATUS FOR DESTRUCTIVE TESTING OF POWER SEMICONDUCTORS

TECHNICAL FIELD OF THE INVENTION

The present invention relates generally to testing power semiconductor chips, and more particularly, to a method and apparatus for testing power semiconductor chips in wafer, chip or package form to destructive limits while limiting physical damage to the chip in order to allow better failure analysis and reduce, or eliminate damage to nearby semiconductor devices.

DESCRIPTION OF THE RELATED ART

Power semiconductor devices are fabricated by a series of batch processes in which wafers, typically of silicon or other compatible material, are processed to produce a particular type of power semiconductor chip. Each wafer contains a plurality of power semiconductor die or chips, typically of the same kind. As is known, chemical, thermal, photolithographic and mechanical operations are typically involved in the fabrication of the power semiconductor wafer.

Due to variations across the wafer and across each individual chip caused by process variables or physical phenomena, not all chips on the wafer will meet the desired specifications for the chips. Some method of testing must be employed to determine which chips on a given wafer meet the specifications. Since the power semiconductors are designed to handle high currents and voltages, it is desirable to test the chip at its rated conditions as early as possible in the production process. This results in eliminating chips that have defects while their cost is relatively low and as a benefit of limiting physical damage during high power testing, failure analysis can be performed.

This is very difficult using conventional manufacturing processes and presents several unique problems when performing the tests on the wafer or the chip before it is assembled into a package designed to handle the high power levels. Note that similar problems occur when packaged power devices are tested.

Since the device is typically tested at its maximum current and voltage level specifications, when failures occur at these high power levels, considerable physical damage may occur to the semiconductor chip and to nearby chips (which have already passed testing) adjacent to the part being tested. This makes it virtually impossible to perform failure analysis and determine the root cause of failure. In addition, the probe tips that connect to the chip being tested may be damaged due to the collateral damage on the chip.

U.S. Pat. No. 7,521,947 (Rogers et al., Apr. 21, 2009) relates to the protection of probe needles during high current probe testing of power devices. The method described in U.S. Pat. No. 7,521,947 makes it possible to perform high current testing of power devices in chip or wafer form. In the event of probe contact resistance problems, the probe needles are protected. A unique combination of current limiting and sensing the voltage across the current limiters triggers protection of the probe needles.

While the above-described technique is very effective in protecting the probe needles from damage based on their individual current and voltage rating, it is also desirable to protect the device under test, nearby devices and probe needles from excessive damage caused during failure of the device. If the device is allowed to fail normally, the high currents and voltages may cause considerable physical damage to the semiconductor chip, which limits or prevents effective failure analysis. As an example, in avalanche testing (Unclamped Inductive Switching, UIS) of power Metal Oxide Silicon Field Effect Transistor (MOSFET) or Insulated Gate Bipolar Transistor (IGBT) devices, those which fail typically exhibit a partially shorted fault path from drain/collector to source/emitter. This concentrates most of the current passing through the device into a very small channel in the chip. Because of the high power concentration in the fault channel area, damage to the silicon may be so extensive it is impossible to determine where the original failure occurred. In some cases large areas or the entire chip are blown up or melted during the failure event. The resulting fracturing and splattering of semiconductor material and aluminum coatings further multiplies the extent of collateral damage. Engineers need to find the exact point of failure on the semiconductor chip to improve the design or process in order to produce a more rugged device. Therefore, it is very desirable to limit the damage to the chip as much as possible.

SUMMARY

A protection device and method in accordance with the present invention enable detection of device failure during a high current test and, prior to catastrophic destruction of the device, power is diverted away from the semiconductor device so as to limit damage thereto. The system and method in accordance with the present invention also enable the test current provided to the device to be quickly diverted away from the device under test when a failure occurs to limit damage to the device. Further, the system and method in accordance with the present invention enable the occurrence of a failure condition to be quickly sensed in order to divert the current away from the device under test to limit the amount damage to the device.

According to one aspect of the invention, a semiconductor protection apparatus for minimizing damage to a semiconductor device that fails while undergoing testing includes: detection circuitry configured to detect failure of the semiconductor device while the semiconductor device is under test conditions; and protection circuitry operatively coupled to the detection circuitry and configured to divert power from the semiconductor device upon the detected failure of the semiconductor device.

According to one aspect of the invention, the detection circuitry is configured to monitor a voltage of the semiconductor device, and conclude the semiconductor device has failed when the monitored voltage drops by at least a predetermined value.

According to one aspect of the invention, the detection circuitry is configured to monitor the voltage while the semiconductor device is in avalanche mode.

According to one aspect of the invention, the detection circuitry is configured to monitor a drain current of the semiconductor device, and conclude the semiconductor device has failed when a slope of the drain current changes by at least a predetermined value.

According to one aspect of the invention, the detection circuitry is configured to monitor the slope of the drain current while the semiconductor device is in avalanche mode.

According to one aspect of the invention, the detection circuitry is configured to monitor a time period in which the semiconductor device is in avalanche mode, and conclude the semiconductor device has failed when the time period in avalanche mode exceeds a predetermined time period.

According to one aspect of the invention, the detection circuitry includes at least one input for receiving electrical data corresponding to the semiconductor device, and at least one output indicative of failure of the semiconductor device, the at least one output operatively coupled to the protection circuitry.

According to one aspect of the invention, the device further includes a semiconductor tester for testing the semiconductor device, wherein the detection circuitry is communicatively coupled to the semiconductor tester.

According to one aspect of the invention, the semiconductor tester is configured to perform an unclamped inductive switching test on a power semiconductor device.

According to one aspect of the invention, the semiconductor tester and the semiconductor protection device are formed as an integral unit.

According to one aspect of the invention, the semiconductor tester comprises a socket including a plurality of terminals for electrically coupling to the semiconductor device, and wherein the protection circuitry includes a parallel path element coupled to the socket and configured to divert power from the semiconductor device through the parallel path element.

According to one aspect of the invention, the parallel path element comprises at least one of a silicon controlled rectifier (SCR), a power metal oxide field effect transistor (MOSFET) device, an insulated gate bipolar transistor (IGBT) device, a mechanical relay, or a solid state relay.

According to one aspect of the invention, the semiconductor device is at least one of an integrated circuit or a power semiconductor.

According to one aspect of the invention, a method for limiting damage to a semiconductor device under test when the semiconductor device fails during a high current test includes: detecting the occurrence of a failure of the device under test, and; diverting power applied to the semiconductor device through a parallel path element upon detection of failure of the semiconductor device.

According to one aspect of the invention, detecting the occurrence of a failure includes monitoring a voltage of the semiconductor device during test conditions, and concluding the semiconductor device has failed when the monitored voltage collapses while the semiconductor device is in avalanche mode.

According to one aspect of the invention, detecting the occurrence of a failure includes monitoring a drain current of the semiconductor device, and concluding the semiconductor device has failed when a slope of the drain current changes while the semiconductor device is in avalanche mode.

According to one aspect of the invention, detecting the occurrence of a failure includes monitoring a time period in which the semiconductor device is in avalanche mode, and concluding the semiconductor device has failed when the time period in avalanche mode exceeds a predetermined time period.

According to one aspect of the invention, diverting power includes using at least one of a silicon controlled rectifier (SCR), a power metal oxide field effect transistor (MOSFET) device, an insulated gate bipolar transistor (IGBT) device, a mechanical relay, or a solid state relay as the parallel path element.

According to one aspect of the invention, a method for testing a device under test includes using the apparatus described herein to ramp a test current from an initial level to a target level, wherein as the current is ramped it is diverted away from the device under test. Subsequent to the test current reaching the target level, the apparatus described herein is used to force the test current through the device under test.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the scope of the claims appended hereto.

Features that are described and/or illustrated with respect to one embodiment may be used in the same way or in a similar way in one or more other embodiments and/or in combination with or instead of the features of the other embodiments.

DETAILED DESCRIPTION OF EMBODIMENTS

Figure 1:
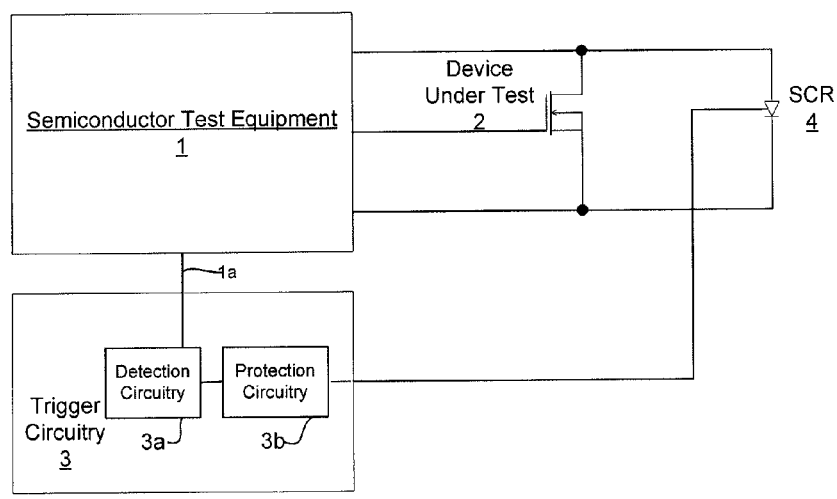
FIG. 1 is a block diagram illustrating the concept of using an SCR protection technique in combination with a typical semiconductor test system.

Referring to FIG. 1, semiconductor test equipment 1, such as an ITC55100 Unclamped Inductive Switching test system, is used to test a device under test 2. It should be appreciated that reference to the ITC55100 test system is merely exemplary, and other semiconductor test systems can be used as the semiconductor test equipment 1 without departing from the scope of the invention. The semiconductor test equipment 1 can perform standard Unclamped Inductive Switching test on devices such as power MOSFET transistors. Thus, in the exemplary configuration shown in FIG. 1, the source, drain and gate connections of the power MOSFET (i.e., the DUT 2 in the present example) are electrically coupled to the semiconductor test equipment 1.

Additionally, a protective element 4 (e.g., a "crowbar") such as an SCR, is electrically coupled to the DUT 2 in a parallel configuration. More specifically, an anode and cathode of an SCR 4 are electrically coupled to the DUT 2 (e.g., to the source and drain connections of the power MOSFET in the present example) so as to form an alternate path for power (e.g., when the SCR 4 is turned on, power will bypass the DUT 2 and pass through the SCR 4). A gate of the SCR 4 is coupled to trigger circuitry 3.

The crowbar trigger circuitry 3, which may be communicatively coupled to the semiconductor test equipment 1 via a cable connection 1a or the like, includes detection circuitry 3a and protection circuitry 3b, wherein the detection circuitry 3a is operatively coupled to the protection circuitry 3b so as to inform the protection circuitry 3b of a fault condition. The SCR 4 is operatively coupled to the protection circuitry 3b so as to turn on based on an output of the protection circuitry 3b.

The detection circuitry 3a is configured to monitor parameters (e.g., current, voltage, etc.) of the DUT 2 as received from the semiconductor test equipment 1 (e.g., parameters may be communicated to the detection circuitry 3a via the cable connection 1a) during a test procedure. Alternatively, the detection circuitry 3a may directly receive the DUT parameters (e.g., via circuits (not shown) that interface with the DUT 2). Based on the monitored data and a defined fault condition, the detection circuitry 3a provides a control signal to the protection circuitry 3b, which in turn commands the SCR 4 to turn on so as to divert power from the DUT 2. As used herein, the term "divert" is defined as to remove power from a device by providing the power to an alternate device or providing an alternate current path.

For example, the detection circuitry 3a may monitor the DUT 2 current, DUT 2 voltage, DUT 2 power, etc., and, if the one or more monitored values exceed a predetermined threshold, the detection circuitry 3a informs the protection circuitry 3b of a fault condition. The protection circuitry 3b then provides an output to the gate of SCR 4, thereby turning on the SCR 4. Alternatively, the detection circuitry 3a may simply command the protection circuitry 3b to turn on the SCR 4 at a defined time during the test sequence. When the SCR 4 is turned on, the current flowing in the DUT 2 is diverted away from the DUT 2 and passes through the SCR 4. If this operation is performed in a very short time when a failure mode is first detected, the damage to the DUT 2 caused by continued current flow and power in the DUT 2 can be limited.

While FIG. 1 illustrates an SCR as a parallel element to the DUT 2, other types of devices may be used. For example, a power MOSFET, an IGBT, a mechanical relay, a solid state relay, or the like may be used as the parallel element in FIG. 1. Triggering of such devices may be via an output from the protection circuitry 3b using conventional techniques.

Figure 2:
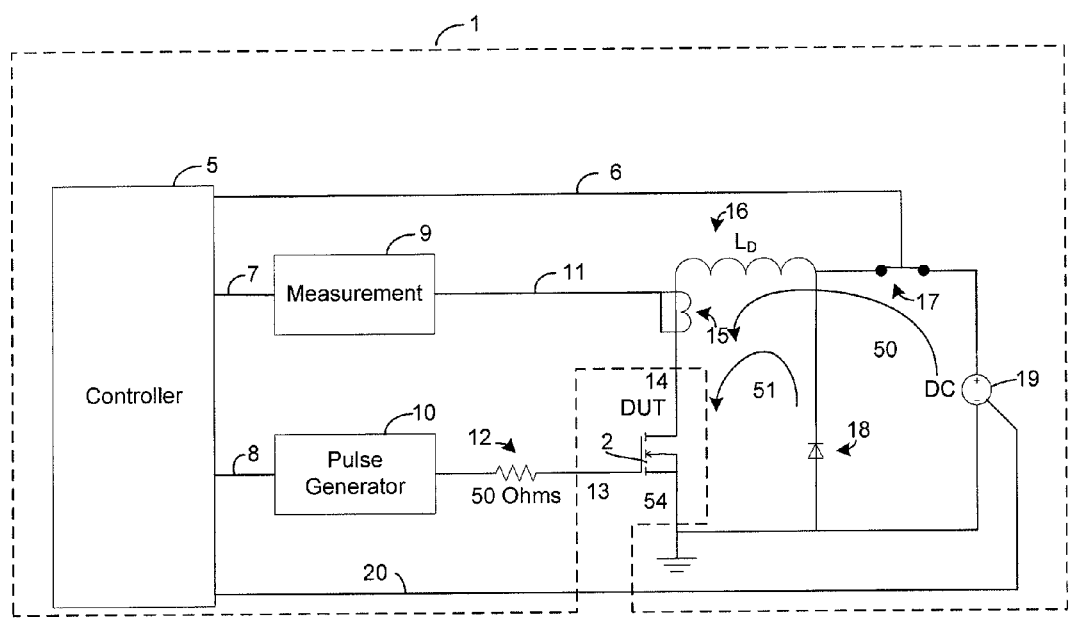
FIG. 2 is a schematic diagram illustrating an exemplary ITC55100 Unclamped Inductive Switching tester and the associated Device Under Test (DUT).

Referring to FIG. 2, a more detailed view of the exemplary semiconductor test equipment 1 is provided. The exemplary semiconductor test equipment 1 includes a controller 5 (e.g., a processor, memory and instructions stored in memory and executable by the processor) operatively coupled to measurement circuitry 9, pulse generator 10 and DC power supply 19 via connections 7, 8 and 20, respectively. The measurement circuitry 9 is further coupled to one or more devices, such as current sensor 15 via connection 11 and high speed switch 17 via connection 6. As will be appreciated, there may be a number of other types of sensors within the semiconductor test equipment 1 depending on the specific devices being tested and the specific tests that are to be performed.

A first terminal of the high speed switch 17 is coupled to a positive terminal of the DC power supply 19, and a second terminal of the high speed switch 17 is coupled to a first leg of an inductor 16 and a cathode of a free-wheeling diode 18. The anode of the free-wheeling diode 18 is coupled to the drain 14 of the DUT 2, the negative terminal of the power supply 19, and signal common. The second leg of the inductor 16 is coupled to the source 54 of the DUT 2, and a gate 13 of the DUT 2 is coupled to the pulse generator 10 via a resistor 12.

The controller 5 sequences operations and performs logical operations to perform, for example, the UIS test. At the start of the test, the DUT 2 is turned off with its gate terminal 13 at or near zero volts so no current is flowing into the drain 14. The DC power supply 19 is set to a voltage sufficient to drive the required current through the inductor Ld 16 to perform the test. The controller 5 then turns on the high speed switch 17 and the pulse generator 10 is signaled to switch to a proper voltage to turn on the DUT 2. The transient gate current is limited by the 50 Ohm resistor 12 in series with the gate terminal 13. The DUT 2 is turned on and passes current 50 from the DC supply 19 through the inductor Ld 16. The current is sensed by the current monitor 15 in the drain circuit. The measurement circuitry 9 measures the magnitude of the current 50 and when the programmed test current is reached, signals the controller 5. When the controller 5 receives the signal that the current 50 is at the correct value, the controller 5 signals the high speed switch 17 to turn off and signals the pulse generator 10 to switch to the proper voltage to turn off the DUT 2.

The inductor Ld 16 now has stored energy equivalent to one half the product of the value of Ld 16 in Henries and the square of the current 50 in Amperes. This energy seeks to continue the flow of current and, since the switch 17 is open, switches to a new path 51 through the free-wheeling diode 18. Since the DUT 2 is turned off, the voltage at the drain node 14 rises until the device goes into avalanche mode, thus allowing the current 51 to flow. This condition continues until the energy in the inductor Ld 16 is completely dissipated. During the time the inductor Ld 16 is transferring energy, the DUT 2 experiences simultaneous high voltage and high current conditions. Thus the energy in the inductor Ld 16 is dissipated by the DUT 2.

Figure 3:
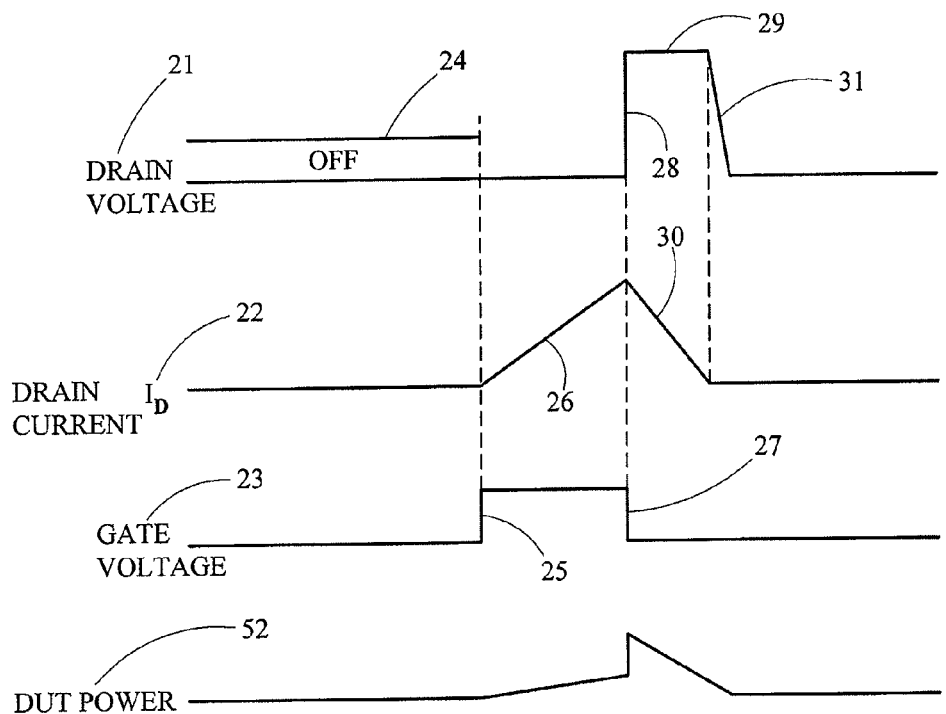
FIG. 3 shows typical waveforms generated during an Unclamped Inductive Switching (UIS) test of a power MOSFET device that does not fail during test.

Referring additionally to FIG. 3, the drain voltage 21, drain current 22, gate voltage 23 and DUT power 52 waveforms are shown for a DUT 2 which properly responds to the UIS test, i.e., a good or passing device. In the first part of the test, the DUT 2 is off and the drain voltage 21 is floating 24. When the gate voltage 23 is turned on 25, the DUT 2 turns on and passes drain current 22. The drain current 22 increases linearly 26 at a rate determined by the value of the power supply 19 and the inductor Ld 16 value. When the desired peak current is reached, the gate voltage 23 is turned off 27. The drain voltage 21 rises rapidly 28 to the avalanche voltage 29 of the DUT 2. The drain voltage 21 will remain at the avalanche voltage 29 as the drain current 22 linearly decreases 30 to zero as the energy in the inductor Ld 16 is dissipated. The time required to discharge the inductor Ld 16 is inversely proportional to the avalanche voltage 29, and directly proportional to the peak drain current 22 and the value of the inductor Ld 16. Because the avalanche voltage 29 is typically fairly high, the time to discharge the energy is relatively short so device heating is typically not a problem. The DUT power 52 peaks very quickly and decreases through the time the avalanche voltage is high.

Figure 4:
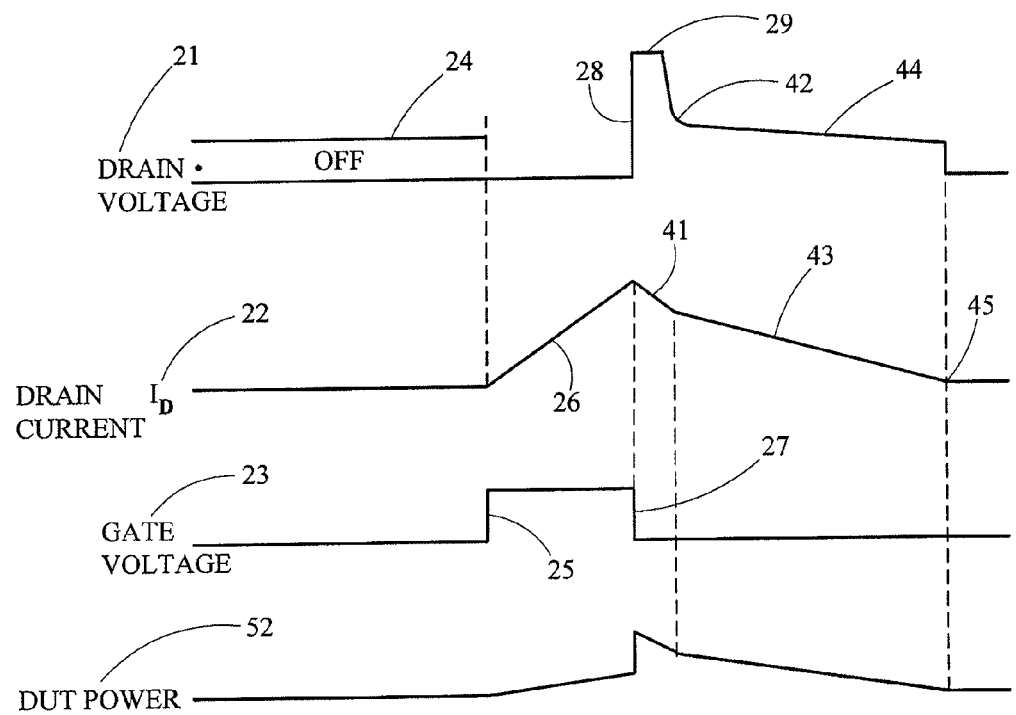
FIG. 4 shows typical waveforms generated during an Unclamped Inductive Switching (UIS) test of a power MOSFET device that does fail during the test.

Referring now to FIG. 4, the waveforms are shown for a device which fails during the avalanche test. The operation is identical for the first part of the test when the DUT 2 goes into avalanche mode with avalanche voltage 29. At some time during the avalanche period 29, the DUT 2 fails and the drain voltage drops to a lower level 42. The drop in voltage is caused by a partial shorting from drain 14 to source 54 of the DUT 2 via a small "pipe" of melted silicon through the device. The current in the DUT is then concentrated in this small area. Because the drain voltage 21 is lower, the discharge time of the inductor Ld 16 is extended and the drain current 22 remains elevated 41, 43 for a longer period of time 44. During this extended time period 44, the DUT power 52 remains high in the DUT 2 causing the temperature to rise to very high, potentially to destructive levels. The area around the original failure, which is typically very small, will then completely melt the surrounding silicon and be so damaged that is impossible to determine the exact position of the original failure.

Figure 5:
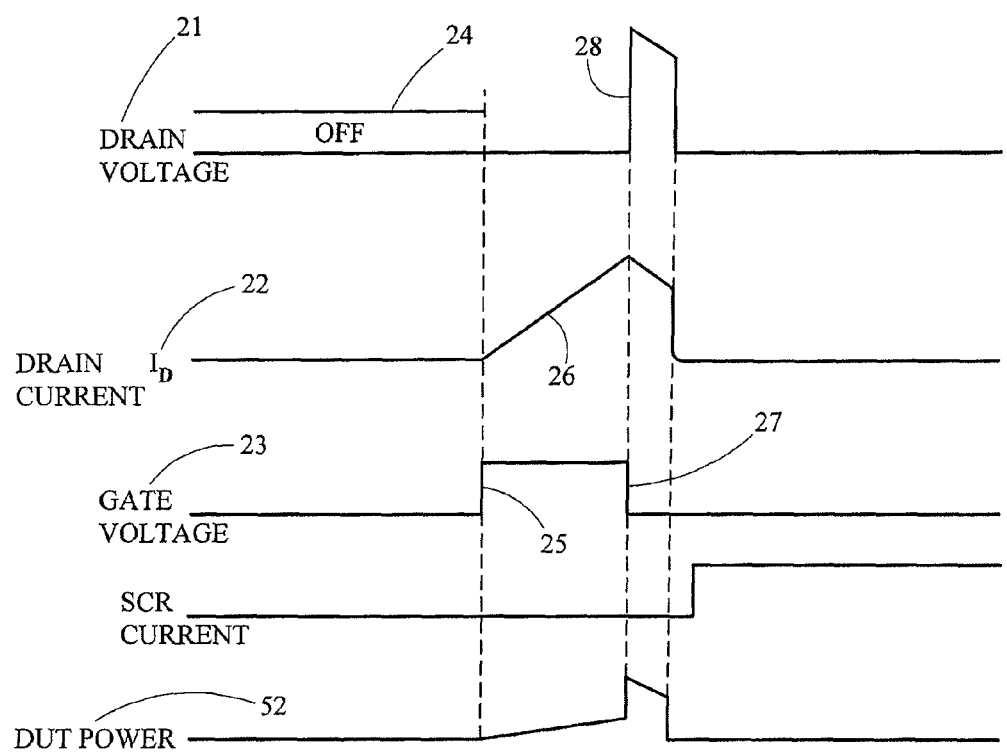
FIG. 5 shows the waveforms of a power MOSFET device undergoing failure when protected by the device and method in accordance with the invention

Referring again to FIG. 1, in one possible embodiment of the invention, the trigger circuitry 3 senses the falling edge of the drain voltage 21 to trigger the SCR 4. In the case of a good device in FIG. 3, there is no significant droop of drain voltage and the SCR is not triggered and has no effect in the testing. When a DUT 2 fails as in FIG. 4, the SCR 4 is triggered on at the failure point on the drain waveform 42 when the voltage drops below a specified voltage. This effectively removes the current and consequentially the power from the DUT 2 by shunting the current through the SCR 4. FIG. 5 illustrates the waveforms when the SCR 4 is fired. As per the waveforms in FIG. 5, the DUT current 22 drops quickly to zero as the SCR 4 turns ON to pass current, and the DUT drain voltage 21 also drops to zero. Therefore, when the SCR 4 turns ON, the DUT power also drops to zero. As a result, the DUT 2 no longer is subjected to the extended heating and therefore the damage is limited to the immediate area of the initial failure. The SCR 4 functions as a bypass element routing the current around the DUT 2. Other suitable elements such as power MOSFET, IGBT, mechanical relay contact, solid state relay contact, etc. could be substituted for the SCR 4 to perform the same function. Note that when the SCR is triggered, the test result of this test would still be an "Avalanche Failure" and the test result is not affected.

A second embodiment of the invention is possible using a different sensing method to trigger the SCR 4. For example, the slope change in the drain current 21 in FIG. 4 could be used as a trigger point for the SCR 4 in FIG. 1. Preferably, a change in drain current slope of two percent or less can be used as a trigger point for the SCR. One could also use a simple time based trigger since the time in avalanche 29 is known from the values of inductance 16, drain current 22 and avalanche voltage 29. In the event of a failure during the avalanche period the power dissipated in the device would be limited to a known maximum value proportional to the normal avalanche time.

The specific thresholds used by the trigger circuitry 3 can be stored in memory of the trigger circuitry 3. A processing device or the like can monitor the DUT parameters and compare them to the stored values. If the monitored values exceed the threshold values, then the output to the SCR 4 can be triggered to fire the SCR 4, thereby diverting power away from the DUT 2.

Figure 6:
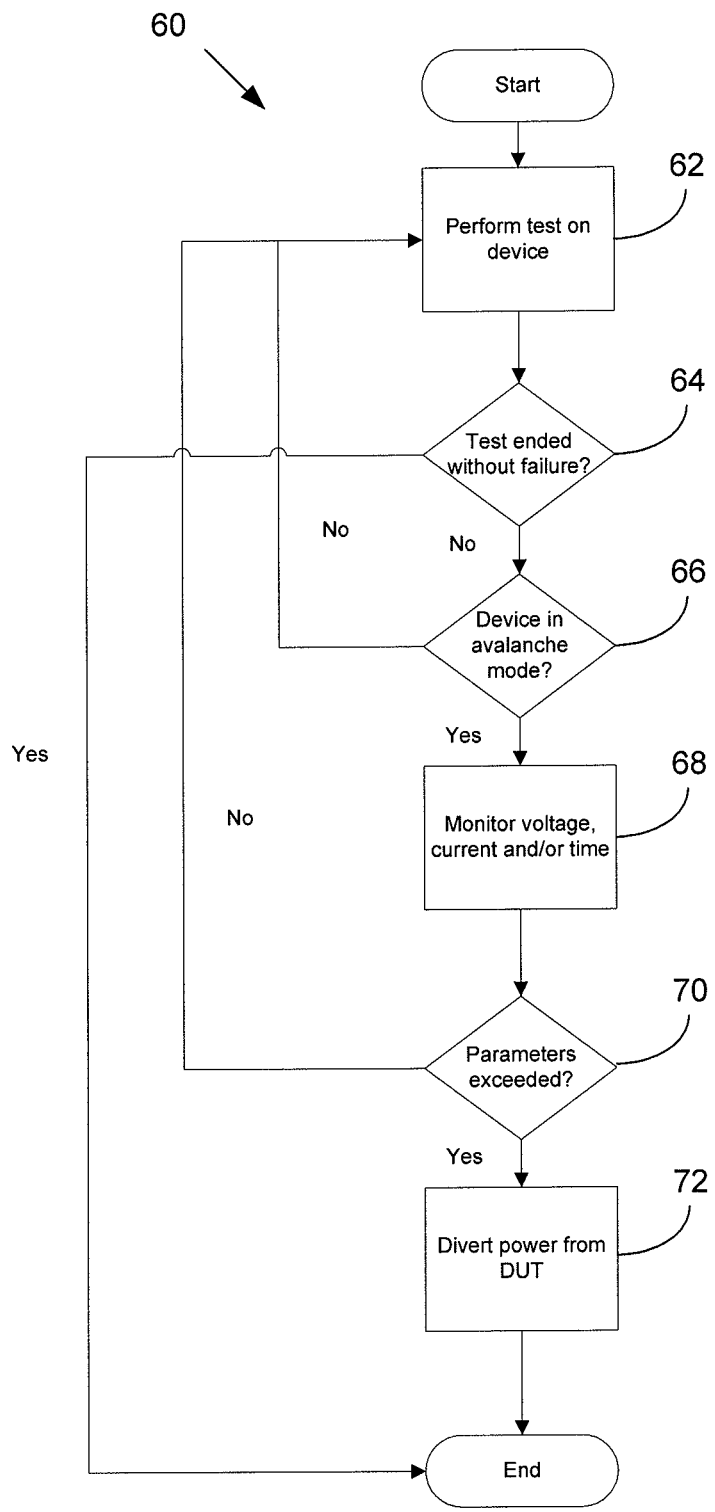
FIG. 6 is a flow chart showing the steps of an exemplary method in accordance with the present invention.

With additional reference to FIG. 6, illustrated are logical operations to implement an exemplary method 60 of protecting a device under test from catastrophic damage during failure of the device. Although FIG. 6 shows a specific order of executing functional logic blocks, the order of executing the blocks may be changed relative to the order shown. Also, two or more blocks shown in succession may be executed concurrently or with partial concurrence. Certain blocks also may be omitted. In addition, any number of functions, logical operations, commands, state variables, semaphores or messages may be added to the logical flow for purposes of enhanced utility, accounting, performance, measurement, troubleshooting, and the like. It is understood that all such variations are within the scope of the present invention.

Beginning at block 62, a test is performed on a semiconductor device. For example, the semiconductor device may be a power MOSFET, and the test performed on the device may be standard Unclamped Inductive Switching test. At block 64 it is determined if the test ended normally. If the test ended normally, then the method ends. However, if the test is still ongoing, then at block 66 it is determined if the device is in avalanche mode. For example, it may be determined the power MOSFET is in avalanche mode if the gate voltage of the power MOSFET is at or near zero and the drain voltage of the power MOSFET is above a predetermined threshold or that the drain current is decreasing at a rate consistent with the applied test parameters. If the above conditions are not met, then it may be concluded the power MOSFET is not in avalanche mode.

If the power MOSFET is not in avalanche mode, then the method moves back to block 62 and continues. However, if the power MOSFET is in avalanche mode, then at block 68 parameters of the power MOSFET are monitored. For example, the drain voltage, drain current and/or time in avalanche mode may be monitored. At block 70, if the drain voltage collapses by a predetermined amount, a slope of the drain current changes by a predetermined amount, and/or the time period in avalanche mode exceeds a predetermined time period, then it is concluded that the device has failed. If the device has failed, then at block 72 power is diverted from the power MOSFET, otherwise the method moves back to block 62.

Accordingly, by detecting when the device under test just begins to fail, power can be diverted from the device under test, thereby limiting the damage to the device. Since damage is limited, the device can be analyzed to determine a cause of the failure. Further, reducing the damage to chips on a wafer also reduces the incidences of collateral damage to probe tips, adjacent chips on the wafer, the wafer itself, e.g., wafer fractures, and welding of backside wafer metallization to wafer prober chucks. These damage scenarios are all due to DUT failures which result in large amounts of energy being dissipated by the DUT during a UIS failure. By minimizing damage to the device under test, collateral damage also can be minimized.

Diversion of power away from the device under test also can be used in other testing scenarios such as performing UIS testing on diodes or SCRs. With diodes, SCRs and other semiconductor devices, UIS tests require that the current through the inductor be ramped up to a predetermined level, and such ramp up current cannot pass through the device under test. Using the device according to the present invention to divert current away from the device, the current can be ramped up when the current diverter is turned ON, and the current then can be driven into the device under test when the current diverter is turned OFF. The protection method and apparatus described herein is applicable to such scenario. There are numerous other cases in which the method of diverting current and protecting the device under test would apply.

Figure 7:
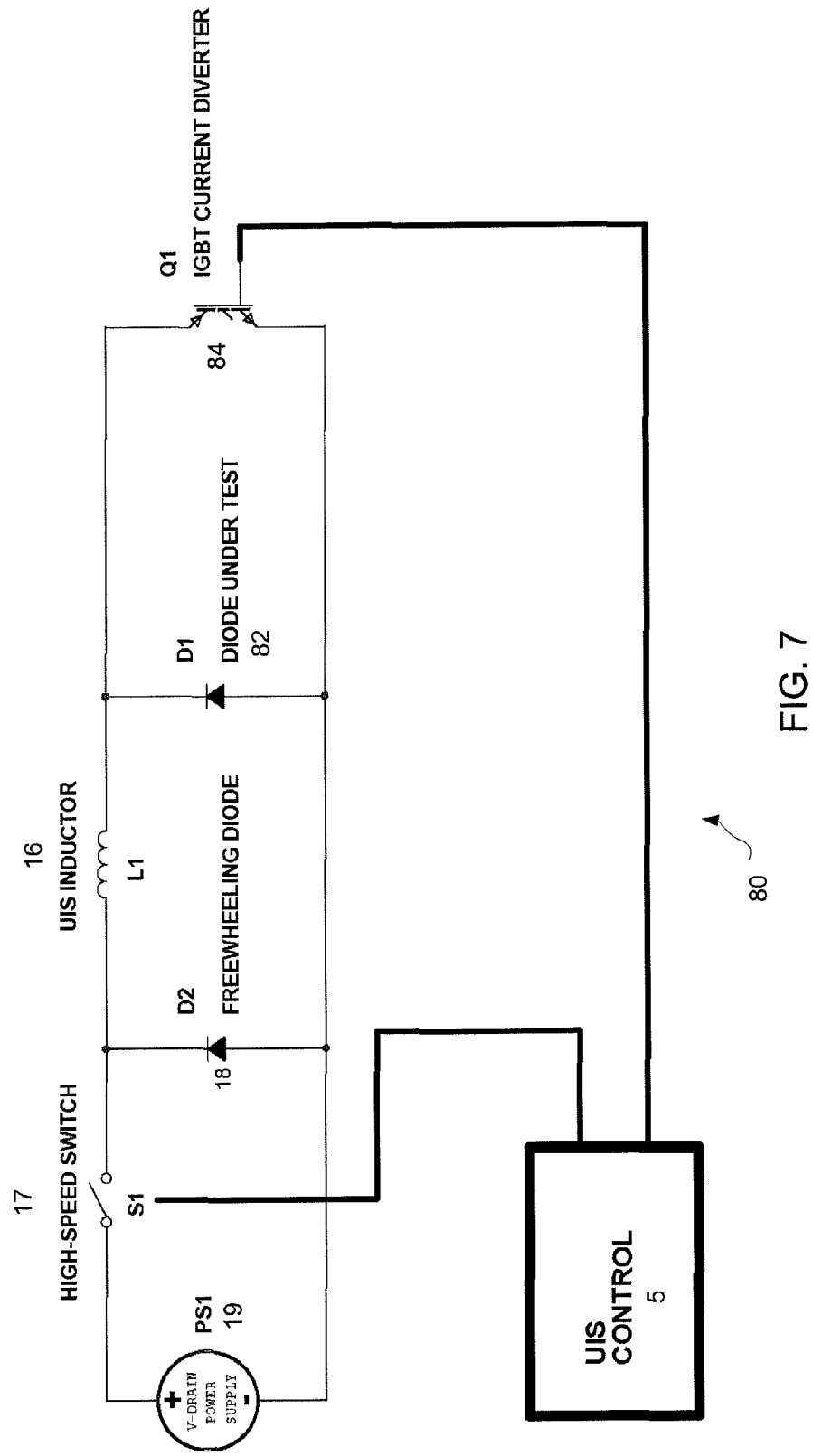
FIG. 7 is an exemplary circuit that may be used to ramp current to predetermined levels prior to supplying the current to a device under test in accordance with the present invention.

FIG. 7 illustrates an exemplary circuit 80 for testing a diode device as described above with respect to UIS testing. The exemplary circuit 80 includes a DC power supply 19 having a positive terminal electrically connected to a first terminal of a high speed switch 17. A second terminal of the high speed switch 17 is electrically connected to a cathode of a freewheeling diode 18, and to a first terminal of an inductor 16. The second terminal of the inductor 16 is electrically connected to the cathode of a diode 82 (i.e., the diode to be tested) and to a collector of a current diverter (e.g., an IGBT 84). The anodes of diodes 18 and 82 as well as the emitter of the IGBT 84 are each electrically connected to the negative terminal of the power supply 19. The switch 17 and the IGBT 84 are both controlled by the controller 5.

To perform a UIS test on the diode 82, the diode 82 is subjected to a predetermined current. In this regard, the current is "ramped up" from an initial value (e.g., 0 amps) up to a target level (e.g., 50 amps), without passing any of the "ramped" current through the diode 82. The actual target current for the test is dependent on the diode being tested. As will be appreciated, diodes designed to handle high power may be subjected to currents that are significantly greater than diodes designed for low power. Once the current has reached the target value, the current diverter is turned off and the current is driven into the diode 82.

To ramp up the current to the target level without subjecting the diode 82 to any of the current, the controller 5 initially commands the IGBT 84 to the ON state, thus shunting the diode 82. The controller 5 then commands the switch 17 to the CLOSED state, thus applying DC power to the circuit. Current then flows through the inductor 16 and through the current diverter 92, bypassing the diode 82 and the freewheeling diode 18. At some time later, the current passing through the inductor 16 reaches the target level, and at this time the controller 5 commands the switch 17 to the OPEN state and the IGBT 84 to the OFF state. Since the current through inductor 16 cannot change instantaneously and since the IGBT 84 is in the OFF state, the current is forced through the diode 82 and circulates through the freewheeling diode 18.

Figure 8:
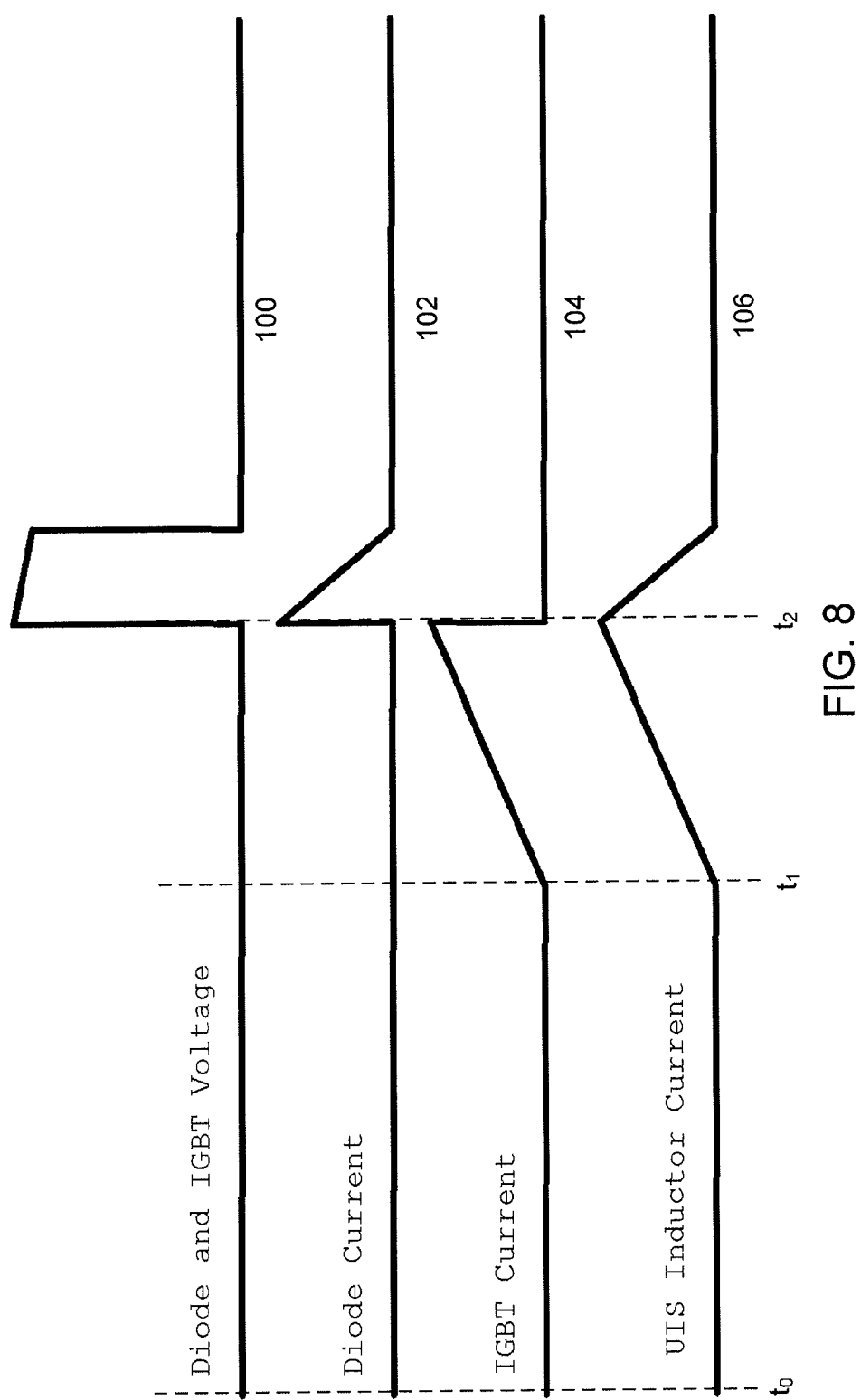
FIG. 8 illustrates exemplary waveforms for the circuit of FIG. 7 during a test operation.

FIG. 8 illustrates exemplary waveforms for the voltage 100 across the diode 82 and IGBT 84, the current 102 passing through the diode 82, the current 104 passing through the IGBT 84, and the current 106 passing through the inductor 16. At time $t_0$ (i.e., prior to testing), the diode current 102, IGBT current 104 and inductor current 106 are each at zero amps, and the diode and IGBT voltage is at zero volts. At time $t_1$ the switch 17 and IGBT 84 are enabled and the test begins. At this time, the current 106 through the inductor 16 and the current 104 through the IGBT 84 ramps up toward a target value. Since the diode 82 is shunted by the IGBT 84, no current flows through the diode 82. At time $t_2$ the current has reached the target level and the switch 17 and IGBT 84 are disabled by the controller 5, resulting in the current 104 through the IGBT 84 stepping to zero amps and the current 102 through the diode 82 stepping to the target level. Also, the voltage 100 across the diode 82 and the IGBT 84 steps up to first level and then begins to decay as the current through the inductor 16 ramps back toward zero amps.

Accordingly, using the circuit 80 in accordance with the invention, current can be ramped to a desired level without subjecting the device under test to the "ramped" current. In this manner, the device under test is not subjected to heat associated with such current, thereby resulting in a more accurate test.

Specific embodiments of the invention have been disclosed herein. Other embodiments of the subject invention will be clear to one of ordinary skill in the art. The Unclamped Inductive Switching test has been used as an example for the preferred embodiment but one of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means".

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of other embodiments, as may be desired and advantageous for any given or particular application.

What is claimed is:

1. A semiconductor protection apparatus for minimizing damage to a semiconductor device that fails while undergoing testing, comprising:
   detection circuitry configured to detect failure of the semiconductor device while the semiconductor device is under test conditions, the detected failure triggered by a voltage collapse of the semiconductor device while the semiconductor device is in avalanche mode; and
   protection circuitry operatively coupled to the detection circuitry and configured to divert power from the semiconductor device upon the detected failure of the semiconductor device, wherein the protection circuitry comprises a protection element configured to shunt current around the semiconductor device under test.

2. The protection apparatus according to claim 1, wherein the detection circuitry is configured to monitor a voltage of the semiconductor device, and conclude the semiconductor device has failed when the monitored voltage drops by at least a predetermined value.

3. The protection apparatus according to claim 2, wherein the detection circuitry is configured to monitor the voltage while the semiconductor device is in avalanche mode.

4. The protection apparatus according to claim 1, wherein the detection circuitry is configured to monitor a time period in which the semiconductor device is in avalanche mode, and conclude the semiconductor device has failed when the time period in avalanche mode exceeds a predetermined time period.

5. The protection apparatus according to claim 1, wherein the detection circuitry includes at least one input for receiving electrical data corresponding to the semiconductor device, and at least one output indicative of failure of the semiconductor device, the at least one output operatively coupled to the protection circuitry.

6. The protection apparatus according to claim 1, further comprising a semiconductor tester for testing the semiconductor device, wherein the detection circuitry is communicatively coupled to the semiconductor tester.

7. The protection apparatus according to claim 6, wherein the semiconductor tester is configured to perform an unclamped inductive switching test on a power semiconductor device.

8. The protection apparatus according to claim 6, wherein the semiconductor tester and the semiconductor protection device are formed as an integral unit.

9. The protection apparatus according to claim 6, wherein the semiconductor tester comprises a socket including a plurality of terminals for electrically coupling to the semiconductor device, and wherein the protection circuitry includes a parallel path element coupled to the socket and configured to divert power from the semiconductor device through the parallel path element.

10. The protection apparatus according to claim 9, wherein the parallel path element comprises at least one of a silicon controlled rectifier (SCR), a power metal oxide field effect transistor (MOSFET) device, an insulated gate bipolar transistor (IGBT) device, a mechanical relay, or a solid state relay.

11. The protection apparatus according to claim 1, wherein the semiconductor device is at least one of an integrated circuit or a power semiconductor.

12. The apparatus according to claim 1, further comprising:
a switch for selectively providing power to the semiconductor device; and
a controller operatively coupled to the switch, the controller configured to command the switch to open to initiate avalanche testing of the semiconductor device.

13. A semiconductor protection apparatus for minimizing damage to a semiconductor device that fails while undergoing testing, comprising:
detection circuitry configured to detect failure of the semiconductor device while the semiconductor device is under test conditions; and
protection circuitry operatively coupled to the detection circuitry and configured to divert power from the semiconductor device upon the detected failure of the semiconductor device, wherein the detection circuitry is configured to monitor a drain current of the semiconductor device, and conclude the semiconductor device has failed when a slope of the drain current changes by at least a predetermined value.

14. The protection apparatus according to claim 13, wherein the detection circuitry is configured to monitor the slope of the drain current while the semiconductor device is in avalanche mode.

15. A method for limiting damage to a semiconductor device under test when the semiconductor device fails during a high current test, comprising:
detecting the occurrence of a failure of the device under test, wherein detecting the occurrence of a failure includes monitoring a voltage of the semiconductor device during test conditions, and concluding the semiconductor device has failed when the monitored voltage collapses while the semiconductor device is in avalanche mode and;
diverting power applied to the semiconductor device through a parallel path element upon detection of failure of the semiconductor device so as to shunt current around the semiconductor device under test.

16. The method according to claim 15, wherein detecting the occurrence of a failure includes monitoring a drain current of the semiconductor device, and concluding the semiconductor device has failed when a slope of the drain current changes while the semiconductor device is in avalanche mode.

17. The method according to claim 15, wherein detecting the occurrence of a failure includes monitoring a time period in which the semiconductor device is in avalanche mode, and concluding the semiconductor device has failed when the time period in avalanche mode exceeds a predetermined time period.

18. The method according to claim 15, wherein diverting power includes using at least one of a silicon controlled rectifier (SCR), a power metal oxide field effect transistor (MOSFET) device, an insulated gate bipolar transistor (IGBT) device, a mechanical relay, or a solid state relay as the parallel path element.

19. A method for testing a device under test using a semiconductor protection apparatus for minimizing damage to a semiconductor device that fails while undergoing testing, the semiconductor protection apparatus including detection circuitry configured to detect failure of the semiconductor device while the semiconductor device is under test conditions, and protection circuitry operatively coupled to the detection circuitry and configured to divert power from the semiconductor device upon the detected failure of the semiconductor device, the method comprising:
using the semiconductor protection apparatus to ramp a test current from an initial level to a target level, wherein while ramping the current is diverted away from the device under test; and
subsequent to the test current reaching the target level, using the semiconductor protection apparatus to force the test current through the device under test.

* * * * *